United States Patent
Rannenberg

(10) Patent No.: US 10,756,665 B2
(45) Date of Patent: Aug. 25, 2020

(54) FAULT ISOLATION FOR PULSE WIDTH MODULATED THREE PHASE MOTOR SYSTEMS

(71) Applicant: Hamilton Sundstrand Corporation, Charlotte, NC (US)

(72) Inventor: George C. Rannenberg, Barkhamsted, CT (US)

(73) Assignee: HAMILTON SUNSTRAND CORPORATION, Charlotte, NC (US)

(*) Notice: Subject to any disclaimer, the term of this patent is extended or adjusted under 35 U.S.C. 154(b) by 24 days.

(21) Appl. No.: 16/047,532

(22) Filed: Jul. 27, 2018

(65) Prior Publication Data
US 2020/0036319 A1    Jan. 30, 2020

(51) Int. Cl.
*H02P 29/024* (2016.01)
*G01R 31/50* (2020.01)
*G01R 19/165* (2006.01)
*G01R 31/02* (2006.01)
(Continued)

(52) U.S. Cl.
CPC .... *H02P 29/0243* (2016.02); *G01R 19/16528* (2013.01); *G01R 31/026* (2013.01); *G01R 31/346* (2013.01); *G01R 31/50* (2020.01); *H02H 7/0844* (2013.01); *G01R 31/343* (2013.01)

(58) Field of Classification Search
CPC .. H02P 29/0243; H02P 29/027; H02P 29/024; H02P 29/032; H02P 21/22; G01R 31/025; H02H 3/08; H02H 7/08; H02H 7/1227
See application file for complete search history.

(56) References Cited

U.S. PATENT DOCUMENTS

| 7,352,545 | B2* | 4/2008 | Wyatt | F04B 49/065 |
| | | | | 318/432 |
| 7,545,111 | B2* | 6/2009 | Fu | G01R 31/24 |
| | | | | 318/276 |
| 8,035,934 | B2 | 10/2011 | Inoue et al. | |

(Continued)

FOREIGN PATENT DOCUMENTS

| EP | 2164169 | A | 3/2010 | |
| EP | 3223424 | A1* | 9/2017 | H02P 29/024 |

OTHER PUBLICATIONS

European Search Report for Application No. 19187002.1-1202, dated Dec. 16, 2019, 10 pages.

*Primary Examiner* — Thai T Dinh
(74) *Attorney, Agent, or Firm* — Cantor Colburn LLP

(57) ABSTRACT

A system and a method of isolating a fault in an electric motor system having a motor drive electronics (MDE) component that is configured to drive an electric motor with a plurality of phases, the MDE executing a method of isolating the fault that includes applying an excitation to a first phase and a second phase of the electric motor in a first direction and sensing a phase current value for each phase phases of the electric motor. The method also includes providing an excitation, for the first and second phase in an opposite direction of the first direction and measuring a phase current value for each phase. The applying, sensing, providing and measuring is repeated for every possible combination of phases of the electric motor. Finally, the method includes isolating the fault within the electric motor system based on the sensed and measured current values.

22 Claims, 4 Drawing Sheets

(51) Int. Cl.
*G01R 31/34* (2020.01)
*H02H 7/08* (2006.01)

(56) References Cited

U.S. PATENT DOCUMENTS

| | | | |
|---|---|---|---|
| 8,497,651 B2 | 7/2013 | Tang et al. | |
| 8,847,536 B2* | 9/2014 | Kumagai | B62D 5/049 318/490 |
| 8,947,028 B2* | 2/2015 | Gu | H02P 29/0243 318/400.02 |
| 9,160,161 B2* | 10/2015 | Li | H02P 29/027 |
| 9,618,582 B2* | 4/2017 | Walters | H02P 6/007 |
| 9,634,604 B2* | 4/2017 | Von Wendorff | B62D 5/0484 |
| 2007/0194734 A1* | 8/2007 | Weinmann | H02P 27/06 318/400.31 |
| 2010/0152940 A1* | 6/2010 | Mitsutani | B60L 50/16 701/22 |
| 2011/0089883 A1 | 4/2011 | Anwar et al. | |
| 2017/0272024 A1 | 9/2017 | Mastrocola et al. | |

\* cited by examiner

US 10,756,665 B2

FAULT ISOLATION FOR PULSE WIDTH MODULATED THREE PHASE MOTOR SYSTEMS

BACKGROUND

The subject matter disclosed herein generally relates to fault detection and, more particularly, fault isolation for a pulse width modulate three phase motor system as are commonly employed in airborne applications.

Modern aircraft utilize electric motors in a multitude of applications; pumps, compressors, actuators, starters, etc. Many of these applications require the relatively sensitive motor drive electronics (MDE) component be located in an environmentally controlled electronic equipment bay. In contrast, the electric motor is remotely located elsewhere on the airframe. Often a significant distance exists between the MDE component and the electric motor located elsewhere in the airframe. The reliability of this type of architecture is dependent on the airframe harnessing and its ability to deliver the signals between the MDE and the motor.

In pulse width modulated three phase electric motor systems, it is often difficult to identify and isolate motor coil shorts and opens in the harnessing and motor from faults within the controlling circuitry of a controller. Current sensing circuitry in the controlling circuitry, normally employed for closed loop operation, provides insight to identify faults but typically does not provide sufficient information to facilitate isolation between components. Accordingly, there is a need to provide a system and method for improving the detection and isolation of system faults.

BRIEF DESCRIPTION

According to one embodiment, a system and a method of isolating a fault in an electric motor system having a motor drive electronics (MDE) component that is configured to drive an electric motor with a plurality of phases, the MDE executing a method of isolating the fault that includes applying an excitation to a first phase and a second phase of the electric motor in a first direction and sensing a phase current value for each phase of the electric motor. The method also includes providing an excitation, for the first and second phase in an opposite direction of the first direction and measuring a phase current value for each phase. The applying, sensing, providing and measuring is repeated for every possible combination of phases of the electric motor. Finally, the method includes isolating the fault within the electric motor system based on the sensed and measured current values.

In addition to one or more of the features described above, or as an alternative, further embodiments may include that the applying comprises activating a sourcing switching device for the first phase and a sinking switching device for the second phase.

In addition to one or more of the features described above, or as an alternative, further embodiments may include that the providing comprises activating a sourcing switching device for the second phase and a sinking switching device for the first phase.

In addition to one or more of the features described above, or as an alternative, further embodiments may include that if the phase current values for each phase of the plurality of phases sensed matches the phase current values for each plurality of phases measured, it is indicative of at least one of an open phase of the electric motor and harness or a short in a winding of the electric motor and harness.

In addition to one or more of the features described above, or as an alternative, further embodiments may include that the fault is isolatable to either an open circuit fault of the electric motor or a short circuit of the electric motor and the fault is isolatable to a particular phase of the electric motor.

In addition to one or more of the features described above, or as an alternative, further embodiments may include that if the phase current values for each phase of the plurality of phases sensed does not match the phase current values for each plurality of phases measured, it is indicative of at a failure of the MDE component.

In addition to one or more of the features described above, or as an alternative, further embodiments may include that the failure of the MDE component is isolatable to at least one of an open circuited source switching device, a short circuited source switching device, an open circuited sink switching device and a short circuited sink switching device for a particular phase of the MDE component.

In addition to one or more of the features described above, or as an alternative, further embodiments may include that the failure of the MDE component is isolatable to a current sense feedback circuit for a particular phase of the MDE component.

In addition to one or more of the features described above, or as an alternative, further embodiments may include that failure of the current sense feedback circuit of the MDE component for the particular phase is further isolatable to a type of failure of the current sense feedback circuit for that particular phase.

In addition to one or more of the features described above, or as an alternative, further embodiments may include that the repeating results defining test results based on the number of phases of the electric motor.

In addition to one or more of the features described above, or as an alternative, further embodiments may include that the electric motor is a three phase motor and the repeating results in three sets of applying, sensing, providing, and measuring.

In addition to one or more of the features described above, or as an alternative, further embodiments may include that isolating the fault based on the measured current values further includes analyzing the sensed and measured current values, deriving differences between the sensed and measured current values and expected current values based on the analysis, and identifying fault location possibilities based on the differences.

In addition to one or more of the features described above, or as an alternative, further embodiments may include identifying and replacing an individual line replaceable component of the electric motor system in response to the isolating the fault.

In addition to one or more of the features described above, or as an alternative, further embodiments may include that the electric motor system is included in an aircraft.

Also described herein in another embodiment is an electric motor system for detecting and isolating a fault. The electric motor system includes a motor drive electronic (MDE) component comprising an inverter with a phase leg including a sourcing switching device and sinking switching device for each phase leg, an electric motor operably connected to the MDE component, wherein the electric motor has a plurality of phases driven by the phase legs from the inverter, and a harness that connects the electric motor to the MDE component, wherein the harnessing includes a plurality of wires. The electric motor system also includes a plurality of sensors that are connected to the MDE component and are configured to sense current values of the MDE component for each phase of the plurality of phases. The MDE component is further configured to implement a method to detect the fault in the electric motor system, apply a known excitation according to a gate switching sequence for a first phase and a second phase of the plurality of phases of the electric motor in a first direction, receive a sensed phase current value of the MDE component for each phase of plurality of phases of the electric motor associated with the applied known excitation; provide a known excitation, at the MDE component, according to a selected gate switching sequence for the first phase and the second phase of the plurality of phases of the electric motor system in an opposite direction of the first direction; and measure a phase current value in the MDE component for each phase of the electric motor associated with the provided known excitation; and repeat the apply, sense, provide and measure steps for every possible combination of phases of the electric motor, and isolating the fault within the electric motor system based on the sensed and measured current values.

In addition to one or more of the features described above, or as an alternative, further embodiments may include that the apply step of the method comprises activating a sourcing switching device for the first phase and a sinking switching device for the second phase and the provide step of the method comprises activating a sourcing switching device for the second phase and a sinking switching device for the first phase.

In addition to one or more of the features described above, or as an alternative, further embodiments may include that if the phase current values for each phase of the plurality of phases sensed matches the phase current values for each plurality of phases measured, it is indicative of at least one of an open phase of the electric motor and harness or a short in a winding of the electric motor and harness.

In addition to one or more of the features described above, or as an alternative, further embodiments may include that the fault is isolatable to either an open circuit fault of the electric motor or a short circuit of the electric motor and the fault is isolatable to a particular phase of the electric motor.

In addition to one or more of the features described above, or as an alternative, further embodiments may include that if the phase current values for each phase of the plurality of phases sensed does not match the phase current values for each plurality of phases measured, it is indicative of at a failure of the MDE component.

In addition to one or more of the features described above, or as an alternative, further embodiments may include that the failure of the MDE component is isolatable to at least one of an open circuited source switching device, a short circuited source switching device, an open circuited sink switching device, a short circuited sink switching device for a particular phase of the MDE component, and a current sense feedback circuit for a particular phase of the MDE component.

In addition to one or more of the features described above, or as an alternative, further embodiments may include that the electric motor is a three-phase motor and the electric motor system is included in an aircraft.

In addition to one or more of the features described above, or as an alternative, further embodiments may include identifying and replacing an individual line replaceable component of the electric motor system in response to the isolating the fault.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

Figure 1:
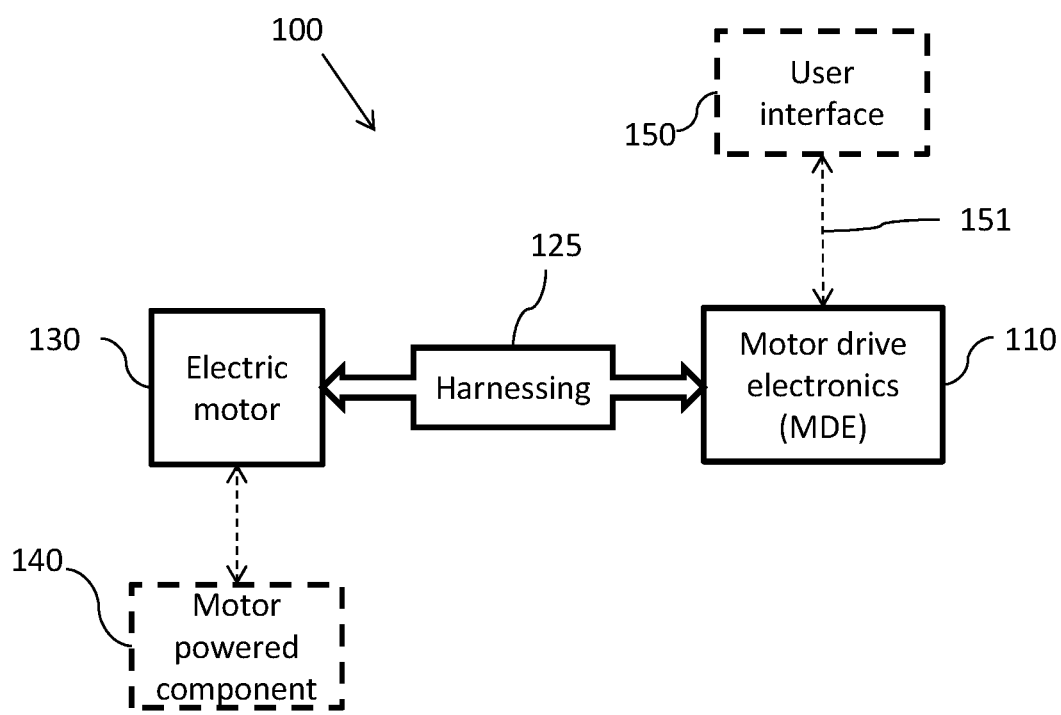
FIG. 1 depicts a block diagram of an electric motor system in accordance with one or more embodiments of the present disclosure.

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in FIG. X may be labeled "Xa" and a similar feature in FIG. Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Embodiments described herein are directed to a system and method that effectively reduces the ambiguity of the failed component following a motor fault. In one embodiment a MDE component contains a 3-phase inverter (IGBT) which drives a 3-phase brushless dc (BLDC) motor through a harness. Various fault conditions exist within this architecture which is common amongst motor drive systems which results in the loss or degradation of system function. According to one or more embodiments, these faults and locations they occur in include, but are not limited to, inverter faults, wiring faults, motor faults, and control sensor faults. Inverter faults include, but are not limited to gate drive open/short circuits, and collector/emitter open/short circuits. Wiring faults include, but are not limited to, phase-to-phase shunt/short/open circuits and phase to ground shunt/short circuits. Motor faults include, but are not limited to, phase-to-phase shunt/short circuits and phase-to-ground shunt/short circuit. Control sensor faults include, but are not limited to current sensor offset/gain shifts. The described embodiments facilitate isolating motor faults from faults within the controlling circuitry using only the functional circuitry, without the addition of any further Built-In-Test (BIT) circuitry employing only current sensing circuitry and without having to use additional external test equipment. Advantageously, the described embodiments provide a reliable method for aircraft maintenance personnel to identify which line replaceable unit exhibits the fault and needs to be replaced in the event of a failure without additional external test equipment.

FIG. 1 depicts a block diagram of an electric motor system 100 in accordance with one or more embodiments of the present disclosure. The electric motor system 100 includes a motor drive electronics (MDE) component 110 and an electric motor 130. The MDE component 110 is communicatively and electrically connected to the electric motor 130 using a harnessing 125 which includes a plurality of wires. According to one or more embodiments, the electric motor 130 may be any electric motor type and size depending on the specific motor powered component 140 that the electric motor 130 is powering. For example, motor powered component 140 may be a pump, compressor, actuator, and/or starter. Further, the motor powered component 140 may include a plurality of elements that the electric motor 130 is powering. For example, an aircraft's electric brake (eBrake) that includes eight actuators can be driven by the single MDE component 110 and electric motor 130.

According to one or more embodiments, the electric motor system 100 may also include a user interface 150 that is connected to the MDE component 110. The user interface 150 may receive and transmit signals 151 to and from the MDE component 110. For example, the user interface 150 may collect and transmit user input signals for controlling the electric motor 130. Further, the user interface 150 may receive information from the MDE component 110 about a detected fault and isolation of that fault. The MDE component 110 may also provide collected current data to the user interface 150 for displaying.

Figure 2:
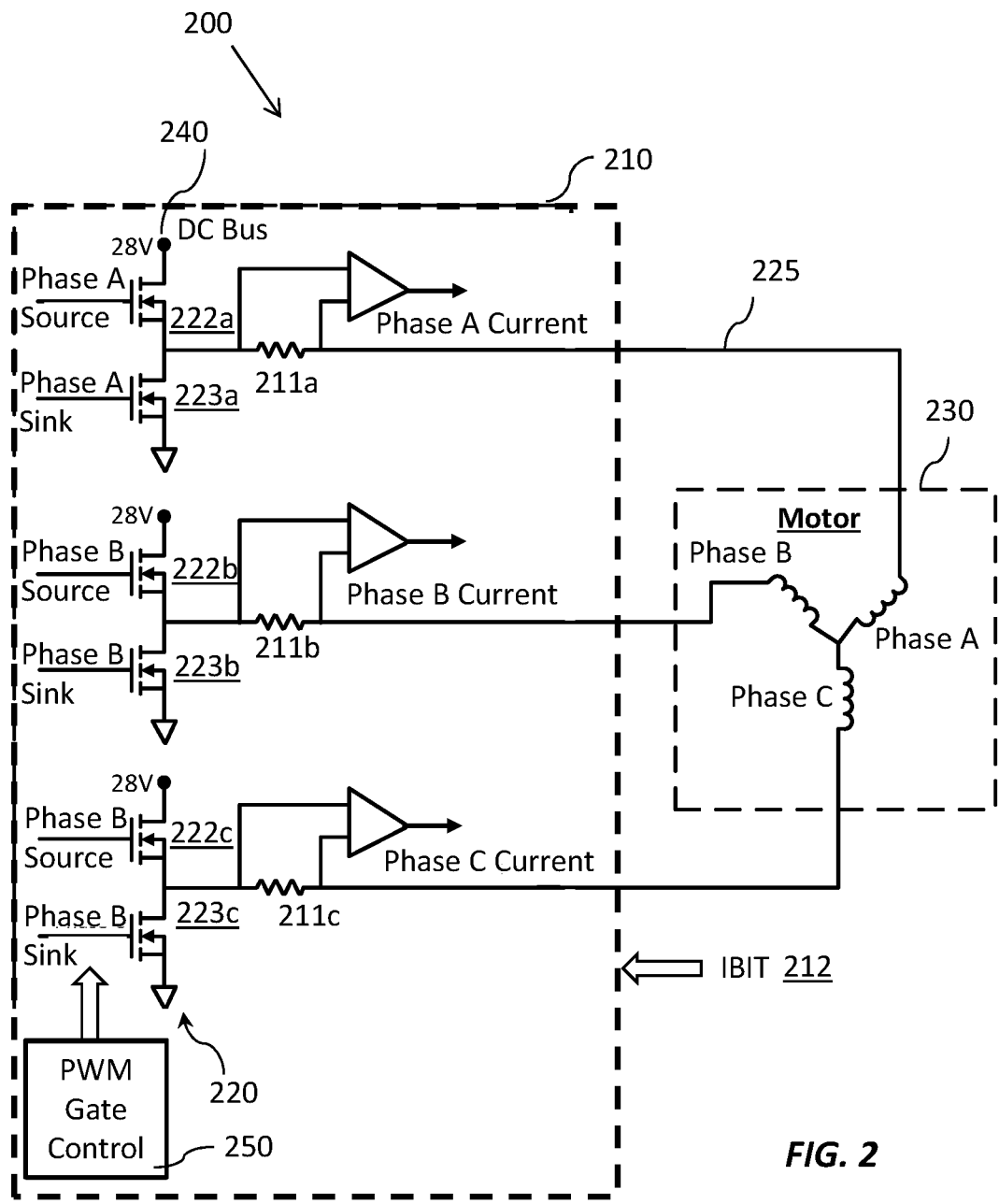
FIG. 2 depicts another electric motor system with MDE component details in accordance with one or more embodiments of the present disclosure.

FIG. 2 depicts another electric motor system 200 in accordance with one or more embodiments of the present disclosure. The electric motor system 200 may include an MDE component 210 that is connected to an electric motor 230 using a harnessing 225. The electric motor system 200 includes phase current sensing. Specifically, the electric motor system 200 includes the MDE component 210 that has the capability to sense current exiting at each phase the MDE component 210. The MDE component 210 further includes an inverter 220 and sensors 211 denoted 211a, 211b and 211c associated with each of the motor phases A, B, and C, and a Proportional Integral (PI) current control and gate signal generation controller 250 as is generally known and employed for controlling a motor 250. In an embodiments the sensors 211a, 211b, and 211c are implemented as resistors with a voltage sensing circuit in the MDE component 210 based on the voltage induced across the resistors. Further, according to one or more embodiments, the MDE component 210 is configured to receive an Interruptive Built-In Test (IBIT) command 212. The IBIT command 212 may be provided by a user using a user interface e.g., 150, another external input, or an input on the MDE component 210.

The inverter 220 includes six switching devices 222, 223 (e.g., FETs, IGBT, transistors, and the like) arranged in pairs, one pair associated with each phase, that provide a three-phase output for controlling a three-phase electric motor 230. According to other embodiments, the number of switches and phase may vary based on the electric motor 230 that is being controlled and powered. As depicted the switching devices 222, 223 are labeled according to their gate inputs and function. For example as depicted the switching devices are denoted as Phase A Source 222a switching device and a Phase A Sink 223 switching device that are connected in series across a DC power supply or bus 240, denoted in this embodiment as 28 VDC, though various other voltages may be employed depending on the application. In aircraft applications buses of 28 VDC and 270 VDC are common. A current sensor 211a has a first side connected at the inverter 220 output between the pair of switching devices 222a and 223a and its other terminal attached at the point where Phase A of the motor 230 connects. Optional voltage sensing also may be employed to monitor the phase A voltages applied by the switching devices 222a-223a to the motor 230. Similarly, a Phase B Source switch 222b and a Phase B Sink switch 223b are provided and are connected in series across the DC power supply 240. Once again, a current sensor 211b has a first terminal connected between the pair of switching devices 222b and 223b and a second terminal attached at the point where Phase B of the motor 230 connects. Optional voltage sensing also may be employed to monitor the phase B voltages applied by the switching devices 222b-223b to the motor 230. Further, a Phase C Source switch 222c and a Phase C Sink switch 223c are provided and are connected in series across the DC power supply 240. A current sensor 211c has its first terminal connected between the pair of switching devices 222c and 223c and its other terminal connected at the point where Phase C of the motor 230 connects. Likewise, optional voltage sensing also may be employed to monitor the phase C voltages applied by the switching devices 222c-223c to the motor 230. The three pairs of switches form legs of the inverter 220 and are connected in parallel across the voltage supply with each other as shown. Accordingly, this embodiment provides a three-phase motor 230 with variable phase control and power.

According to one or more embodiments, the electric motor system 200 can be operated as follows. When the electric motor system 200 is in a standby or initiated built in test (IBIT) mode, a specific switching sequence may be implemented on the 3-phase inverter 220 in order to assess the health of the MDE component 210 including the inverter 220, the external harness 225, and electric motor 230. This switching sequence may be referred to as inverter IBIT and can be initiated at any time for electric motor system 200 evaluation and check out, and specifically following a suspected or identified control fault which may occur due to the aforementioned failure modes.

Continuing with FIG. 2, the described embodiments implement a method executed by the MDE equipment 210 in which a selected phase leg (e.g., Phase A, Phase B, or Phase C) of a motor drive inverter 220 is commanded to pulse it's source switching device e.g., 222a, 222b, 222c or the sink switching device e.g., 223a, 223b, 223c with a steady-state duty cycle. The method includes command one phase to source current, a second phase to sink current, and a third phase to neither sink nor source any current. This process is repeated with each of the legs of the motor drive inverter 220 until all possible combinations are completed. Table 1 defines the possible configurations and the potential fault measurements that may be deduced from the various measurements. In an embodiment, each of the three unique motor coil pairs e.g., Phase A-Phase B, Phase A-Phase C, Phase B-Phase C is subjected to two current tests, one at each of the two possible polarities resulting in six data sets of the three phase current values. In the case of an open motor coil as a failure, only four of the six data sets will have failing current values, and within those six data sets only two of the current values will be failing with less than expected current (the two phases corresponding to the pair of coils under test). In the case of a shorted motor coil, the pattern will be the same except that the failing current values will be greater than expected. Fault isolation is thus performed by comparing the results to a table that identifies the failure patterns that result in the case of an open or shorted motor coil and indicating a motor fault if a match is found. Finally, it may be noted, that any other failures result in indicating the controlling circuitry of the MDE component 210 e.g., inverter 220, switching device 222, 223 or interconnection as being at fault.

Once a failure is identified, it is advantageous to be able to mitigate the problem by isolating failures of the motor control of the MDE component 210 from failures of the motor 230. For example, if the MDE component 210 motor control is attempting to source current to the Phase A coil of the motor 230, a current sense failure e.g. in sensor 211a, or an open Phase A source switching device 222a or an open Phase A coil in the motor 230 will all result in a zero current measurement by the sensor 211a. The method of the described embodiments allows for fault isolation without any additional sensing hardware. With the motor control function of the MDE component 210 operating in an open loop mode during an IBIT function.

Figure 3A:
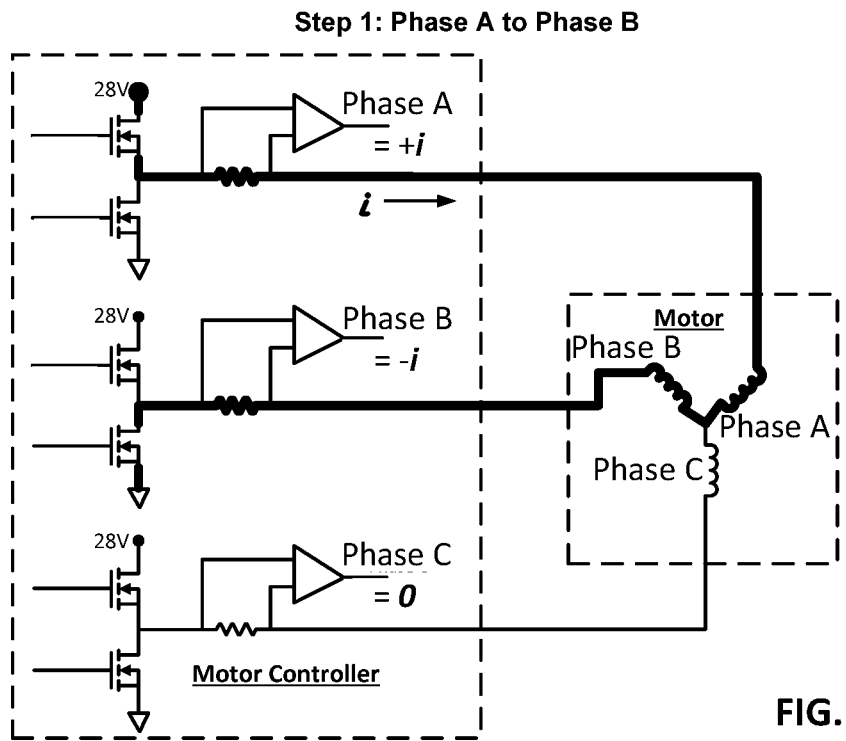
FIG. 3A depicts a simplified depiction of an example current path through the MDE component and motor in accordance with one or more embodiments of the present disclosure.
Figure 3B:
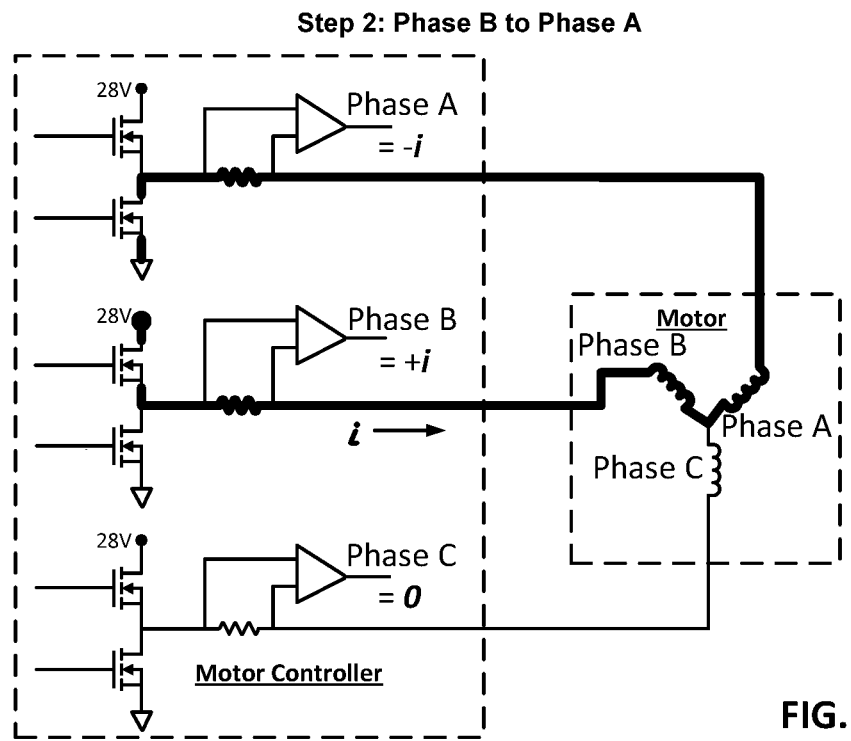
FIG. 3B depicts a simplified depiction of an example opposite direction current path through the MDE component and motor in accordance with one or more embodiments of the present disclosure.

In an embodiment, by commanding a steady-state pulse width to one source driver and one sink driver of a different phase, current "i" will flow through one of the three coil pairs from source to sink in the absence of any failures. Let the following step numbers be assigned to the six different possible ways to produce current "i" through the three coil pairs. At each of the six steps, all three current feedback values for each phase leg as captured by sensor 211a, 211b, and 211c are verified to be within an allowable non-overlapping expected range of the three possible values shown in the diagrams above (e.g., "+i", "–i", or "0"). FIGS. 3A and 3B depict a simplified version of FIG. 2 depicting a first example of these tests for Phase A-Phase B and Phase B-Phase A in accordance with the described embodiments. The bolded lines depict the current path "i" in each instance. Likewise, graphs depicting the current path "i" for the other four test cases for the phase pairs are omitted for simplicity.

Table 1 depicts a set of possible fault results of the testing presuming a motor coil fault (whether open or a short circuit) has been identified. An open circuit or short in the particular coil of the motor 230 will result in out of tolerance "low" or out of tolerance "high" failures of the respective current feedback measurements for a given phase of the motor 230, regardless of the direction of current "i". In other words, a detected failure condition for a fault manifested in the motor coils, will result in the same or symmetrical results for the testing from the first phase to a second, and vice versa, from the second to the first. Thus, it can then be readily inferred that any other pass/fail patterns besides those listed in the table, inherently indicate a failure that is isolatable/attributable to the motor control of the MDE component 210 as described herein.

TABLE 1

Failure indications for Motor winding faults

| Step | Verification (Current Test) | Motor Phase A Coil Failure "Pass/Fail Pattern" | Motor Phase B Coil Failure "Pass/Fail Pattern" | Motor Phase C Coil Failure "Pass/Fail Pattern" |
| --- | --- | --- | --- | --- |
| 1 (Phase A to Phase B) | Phase A Phase C | Fail Fail | Fail Fail | Pass Pass |
| 2 (Phase B to Phase A) | Phase A Phase B Phase C | Fail Fail Pass | Fail Fail Pass | Pass Pass Pass |
| 3 (Phase A to Phase C) | Phase A Phase B Phase C | Fail Pass Fail | Pass Pass Pass | Fail Pass Fail |
| 4 (Phase C to Phase A) | Phase A Phase B Phase C | Fail Pass Fail | Pass Pass Pass | Fail Pass Fail |
| 5 (Phase B to Phase C) | Phase A Phase B Phase C | Pass Pass Pass | Pass Fail Fail | Pass Fail Fail |
| 6 (Phase C to Phase B) | Phase A Phase B Phase C | Pass Pass Pass | Pass Fail Fail | Pass Fail Fail |

In an embodiment, faults identified as a result of the testing methodology described herein that are not attributable to the windings of the motor 230 as described in Table 1 may then be attributed to the control functions, circuitry, and wiring of the MDE component 210. Therefore, in an embodiment, based on the selected results, certain inferences and determinations are possible for further fault isolation as described below.

Table 2 depicts the pass/fail patterns that may be identified for the instances of an open circuited source switching device, e.g., 222a, 222b, 222c or shorted sink switching device e.g., 223a, 223b, 223c. If (for example), the Phase A source switching device 222a is open or the Phase A sink switching device 223a is shorted, the MDE component 210 will be unable to source current into the Phase A coil of the motor 230, but it will still able to sink current from the Phase A coil of the motor 230. Thus, Step 1 results will be identical to the Motor Phase A Coil Failure pass/fail pattern, yet all three current measurements will pass Step 2. In addition, in the case of the shorted Phase A sink switching device 223a, when attempting to send current through the phase B-C motor coil pair, the shorted Phase A sink switching device 223a will pull current from the desired path (when it should not), causing failures of all three phase currents in Steps 5 and 6 of the table. The resultant failure pattern will not match any of the motor failure patterns identified in Table 1, but it provides sufficient information to isolate the failure to the inverter 220 and at least one of the two switching devices 222a and 223a as seen in Table 2. Likewise, similar results will occur for open circuited source switching devices e.g., 222b, 222c, or shorted sink switching devices e.g., 223b, 223c in the MDE component 210 for the other two phases. Thereby, the dissimilar results permit further isolation of the failure to a particular switching device e.g. 222a and 223a, and interconnections associated with it.

TABLE 2

Failure indications for open circuited source switching device or shorted sink switching device.

| | | Phase A | | Phase B | | Phase C | |
|---|---|---|---|---|---|---|---|
| Step | Verification (current) | Open Source Driver Pass/Fail Pattern" | Shorted Sink Driver Pass/Fail Pattern" | Open Source Driver Pass/Fail Pattern" | Shorted Sink Driver Pass/Fail Pattern" | Open Source Driver Pass/Fail Pattern" | Shorted Sink Driver Pass/Fail Pattern" |
| 1 | Phase A | Fail | Fail | Pass | Pass | Pass | Fail |
| (Phase A to | Phase B | Fail | Fail | Pass | Pass | Pass | Fail |
| Phase B) | Phase C | Pass | Pass | Pass | Pass | Pass | Fail |
| 2 | Phase A | Pass | Pass | Fail | Fail | Pass | Fail |
| (Phase B to | Phase B | Pass | Pass | Fail | Fail | Pass | Fail |
| Phase A) | Phase C | Pass | Pass | Pass | Pass | Pass | Fail |
| 3 | Phase A | Fail | Fail | Pass | Fail | Pass | Pass |
| (Phase A to | Phase B | Pass | Pass | Pass | Fail | Pass | Pass |
| Phase C) | Phase C | Fail | Fail | Pass | Fail | Pass | Pass |
| 4 | Phase A | Pass | Pass | Pass | Fail | Fail | Fail |
| (Phase C to | Phase B | Pass | Pass | Pass | Fail | Pass | Pass |
| Phase A) | Phase C | Pass | Pass | Pass | Fail | Fail | Fail |
| 5 | Phase A | Pass | Fail | Pass | Pass | Pass | Pass |
| (Phase B to | Phase B | Pass | Fail | Fail | Fail | Pass | Pass |
| Phase C) | Phase C | Pass | Fail | Fail | Fail | Pass | Pass |
| 6 | Phase A | Pass | Fail | Pass | Pass | Pass | Pass |
| (Phase C to | Phase B | Pass | Fail | Pass | Pass | Fail | Fail |
| Phase B) | Phase C | Pass | Fail | Pass | Pass | Fail | Fail |

Conversely, it should be appreciated that if the Phase A sink switching device 223a exhibits an open circuit or the Phase A source switching device 222a is shorted, the MDE component 210 will be unable to sink current from the Phase A coil of the motor 230 but it will still able to source current into the Phase A coil of the motor 230. Thus, Step 2 results of Table 1 will be identical to the Motor Phase A Coil Failure pass/fail pattern, yet all three current measurements will pass Step 1. In addition, in the case of the shorted Phase A source switching device, when attempting to send current through the phase B-C motor coil pair, the shorted Phase A source driver will inject current into the desired path (when it should not), causing failures of all three phase currents in steps 5 and 6. Table 3 depicts the pass/fail patterns that may be identified for the instances of an open circuited source switching device, e.g., 222a, 222b, 222c or shorted sink switching device e.g., 223a, 223b, 223c or any MDE component failure that has the same effect. The resultant failure pattern will not match any of the above motor failure patterns identified in Table 1, but it provides sufficient information to isolate the failure to the inverter 220 and at least one of the two switching devices 222a and 223a. Likewise, once again, similar result occurs for open sink switching devices 223b, 223c or shorted source switching devices 222b, 222c failures in the MDE component 210 for the other two phases. Thereby, the dissimilar results permit further isolation of the failure to a particular switching device e.g. 222a and 223a, and interconnections associated with it.

TABLE 3

Failure indications for open circuited sink switching device or shorted source switching device.

| | | Phase A | | Phase B | | Phase C | |
|---|---|---|---|---|---|---|---|
| Step | Verification (Current) | Open Sink Driver Pass/Fail Pattern | Shorted Source Driver Pass/Fail Pattern | Open Sink Driver Pass/Fail Pattern | Shorted Source Driver Pass/Fail Pattern | Open Sink Driver Pass/Fail Pattern | Shorted Source Driver Pass/Fail Pattern |
| 1 | Phase A | Pass | Pass | Fail | Fail | Pass | Fail |
| (Phase A to | Phase B | Pass | Pass | Fail | Fail | Pass | Fail |
| Phase B) | Phase C | Pass | Pass | Pass | Pass | Pass | Fail |
| 2 | Phase A | Fail | Fail | Pass | Pass | Pass | Fail |
| (Phase B to | Phase B | Fail | Fail | Pass | Pass | Pass | Fail |
| Phase A) | Phase C | Pass | Pass | Pass | Pass | Pass | Fail |
| 3 | Phase A | Pass | Pass | Pass | Fail | Fail | Fail |
| (Phase A to | Phase B | Pass | Pass | Pass | Fail | Pass | Pass |
| Phase C) | Phase C | Pass | Pass | Pass | Fail | Fail | Fail |
| 4 | Phase A | Fail | Fail | Pass | Fail | Pass | Pass |
| (Phase C to | Phase B | Pass | Pass | Pass | Fail | Pass | Pass |
| Phase A) | Phase C | Fail | Fail | Pass | Fail | Pass | Pass |
| 5 | Phase A | Pass | Fail | Pass | Pass | Pass | Pass |
| (Phase B to | Phase B | Pass | Fail | Pass | Pass | Fail | Fail |
| Phase C) | Phase C | Pass | Fail | Pass | Pass | Fail | Fail |

TABLE 3-continued

Failure indications for open circuited sink switching device or shorted source switching device.

|  |  | Phase A | | Phase B | | Phase C | |
|---|---|---|---|---|---|---|---|
| Step | Verification (Current) | Open Sink Driver Pass/Fail Pattern | Shorted Source Driver Pass/Fail Pattern | Open Sink Driver Pass/Fail Pattern | Shorted Source Driver Pass/Fail Pattern | Open Sink Driver Pass/Fail Pattern | Shorted Source Driver Pass/Fail Pattern |
| 6 (Phase C to Phase B) | Phase A | Pass | Fail | Pass | Pass | Pass | Pass |
| | Phase B | Pass | Fail | Fail | Fail | Pass | Pass |
| | Phase C | Pass | Fail | Fail | Fail | Pass | Pass |

Continuing with FIG. 2 and Table 1, turning now to Table 4 depicts the pass/fail patterns that may be identified for the instances of a current sense feedback sensor or circuit fixed at zero volts. In an embodiment, if a current sense circuit for any phase is stuck at zero, e.g., internal fault of the circuit in the MDE component 210, current sensor 211 shorted, and the like, its associated current measurement will exhibit a failure in every step that it is expected to be non-zero. That is, in the steps of Table 4 where a given phase current (e.g., as sensed at 211a) is expected to be non-zero a faulted sensor or interface will measure zero current when it is expected to be nonzero. Meanwhile, however, the current measurements for the other two phases (e.g., as sensed at 211b, 211c) will pass when they are expected to be non-zero. As a result, there will be steps from Table 1 with only one failing current measurement and the resultant failure pattern will not match any of the above motor coil failure patterns in the steps identified in Table 1, Table 4 but once again provides sufficient information to isolate the failure to the MDE component 210, and more specifically, to the particular current sensor e.g., 211a and associated circuitry.

TABLE 4

Failure indications for current sense feedback circuit fixed at zero volts.

| Step | Verification (Current) | Phase A Current Sense Stuck At 0 Pass/Fail Pattern | Phase B Current Sense Stuck At 0 Pass/Fail Pattern | Phase C Current Sense Stuck At 0 Pass/Fail Pattern |
|---|---|---|---|---|
| 1 (Phase A to Phase B) | Phase A | Fail | Pass | Pass |
| | Phase B | Pass | Fail | Pass |
| | Phase C | Pass | Pass | Pass |
| 2 (Phase B to Phase A) | Phase A | Fail | Pass | Pass |
| | Phase B | Pass | Fail | Pass |
| | Phase C | Pass | Pass | Pass |
| 3 (Phase A to Phase C) | Phase A | Fail | Pass | Pass |
| | Phase B | Pass | Pass | Pass |
| | Phase C | Pass | Pass | Fail |
| 4 (Phase C to Phase A) | Phase A | Fail | Pass | Pass |
| | Phase B | Pass | Pass | Pass |
| | Phase C | Pass | Pass | Fail |
| 5 (Phase B to Phase C) | Phase A | Pass | Pass | Pass |
| | Phase B | Pass | Fail | Pass |
| | Phase C | Pass | Pass | Fail |
| 6 (Phase C to Phase B) | Phase A | Pass | Pass | Pass |
| | Phase B | Pass | Fail | Pass |
| | Phase C | Pass | Pass | Fail |

Likewise, if a current sense circuit (such as the voltage measured across sensor 211a) appears to be fixed at a single voltage, (e.g., stuck at a rail), its associated current measurement will exhibit a failure at every step. However, in this instance the other two current measurements (e.g., as sensed by 211b, 211c) will always pass. Table 5 provides pass/fail indications for the sensed current for instances when the current sense feedback circuit is noted to be fixed at the voltage rail. As a result, once again, in this instance, there will be steps as shown in Table 5 with only one failing current measurement and the resultant failure pattern will not match with any of the above motor failure patterns as identified in Table 1, but once again this test provides sufficient information to isolate the failure to a MDE component 210 and more specifically the particular current sensor e.g., 211a and associated circuitry.

TABLE 5

Failure indications current sense feedback circuit stuck at a rail.

| Step | Verification (Current) | Phase A Current Sense Stuck At Rail "Pass/Fail Pattern" | Phase B Current Sense Stuck At Rail "Pass/Fail Pattern" | Phase C Current Sense Stuck At Rail "Pass/Fail Pattern" |
|---|---|---|---|---|
| 1 (Phase A to Phase B) | Phase A | Fail | Pass | Pass |
| | Phase B | Pass | Fail | Pass |
| | Phase C | Pass | Pass | Fail |
| 2 (Phase B to Phase A) | Phase A | Fail | Pass | Pass |
| | Phase B | Pass | Fail | Pass |
| | Phase C | Pass | Pass | Fail |
| 3 (Phase A to Phase C) | Phase A | Fail | Pass | Pass |
| | Phase B | Pass | Fail | Pass |
| | Phase C | Pass | Pass | Fail |
| 4 (Phase C to Phase A) | Phase A | Fail | Pass | Pass |
| | Phase B | Pass | Fail | Pass |
| | Phase C | Pass | Pass | Fail |
| 5 (Phase B to Phase C) | Phase A | Fail | Pass | Pass |
| | Phase B | Pass | Fail | Pass |
| | Phase C | Pass | Pass | Fail |
| 6 (Phase C to Phase B) | Phase A | Fail | Pass | Pass |
| | Phase B | Pass | Fail | Pass |
| | Phase C | Pass | Pass | Fail |

Finally, it should be noted that if a current sense circuit is fixed at a value which is expected when current "i" is present, it will always fail when current "i" is expected to be zero. This is evident because none of the motor coil failures identified in Table 1 result in non-zero current when zero current is expected. Table 6 provides pass/fail indications for the sensed current for instances when the current sense feedback exhibits a voltage that appears to be fixed at a voltage yet within range. Here are the failure patterns for MDE component 210 failures that result in a current sense feedback e.g. sensor 211 or associated circuitry stuck at an in-range, non-zero value. "X" indicates current measurements that may or may not fail depending on what in-range value the current sense is stuck at. Regardless of whether these measurements pass or fail, the entries marked with an asterisk indicate the parts of the pass/fail pattern that make these faults unique from any motor coil failure patterns of Table 1. Therefore, as a result, the resultant failure pattern will not match any of the above motor failure patterns identified in Table 1, but yielding sufficient information to isolate the failure to that current sensor, e.g., 211a and associated circuitry.

TABLE 6

Failure indications current sense feedback circuit stuck in range.

| Step | Verification (Current) | Phase A Current Sense Stuck In Range "Pass/Fail Pattern" | Phase B Current Sense Stuck In Range "Pass/Fail Pattern" | Phase C Current Sense Stuck In Range "Pass/Fail Pattern" |
|---|---|---|---|---|
| 1 | Phase A | X | Pass | Pass* |
| (Phase A to | Phase B | Pass | X | Pass* |
| Phase B) | Phase C | Pass | Pass | Fail* |
| 2 | Phase A | X | Pass | Pass* |
| (Phase B to | Phase B | Pass | X | Pass* |
| Phase A) | Phase C | Pass | Pass | Fail* |
| 3 | Phase A | X | Pass* | Pass |
| (Phase A to | Phase B | Pass | Fail* | Pass |
| Phase C) | Phase C | Pass | Pass* | X |
| 4 | Phase A | X | Pass* | Pass |
| (Phase C to | Phase B | Pass | Fail* | Pass |
| Phase A) | Phase C | Pass | Pass* | X |
| 5 | Phase A | Fail* | Pass | Pass |
| (Phase B to | Phase B | Pass* | X | Pass |
| Phase C) | Phase C | Pass* | Pass | X |
| 6 | Phase A | Fail* | Pass | Pass |
| (Phase C to | Phase B | Pass* | X | Pass |
| Phase B) | Phase C | Pass* | Pass | X |

It will be appreciated that the described embodiments quickly cycles through the gate drives of the six switching devices Phase A Source switching device 222a, Phase A sink switching device 223a, Phase B source switching device 222b, Phase B sink switching device 223b, Phase C source switching device 222c, and finally, Phase C sink switching device 223c of the inverter 220 individually in a selected pattern and senses at least the current in each of the phases, and optionally the phase voltages for each phase of the motor 230. The testing results in a unique set of defined pass/fail patterns that facilitate determination and isolation of the fault to a given component in the electric motor system 100.

Figure 4:
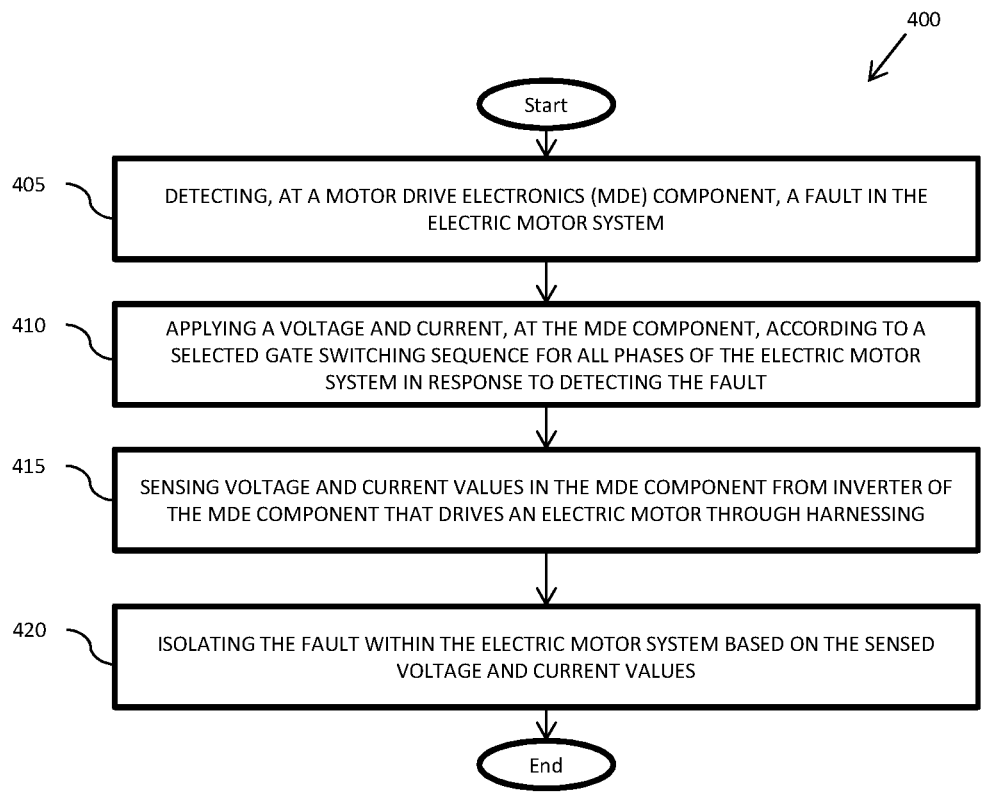
FIG. 4 depicts a method of detecting and isolating a fault in an electric motor system in accordance with one or more embodiments of the present disclosure.

FIG. 4 depicts a method 400 of detecting and isolating a fault in an electric motor system 100 in accordance with one or more embodiments of the present disclosure. The method 400 includes detecting, at a motor drive electronics (MDE) component 210, the fault in the electric motor system 100 as depicted at process step 405. The method 400 also includes applying a voltage and current, at the MDE component 210, according to a selected gate switching sequence for all phases of the electric motor system 100 in response to detecting the fault as depicted at process step 410. The selected gate switching sequence corresponding to the six steps of Table 1 as described herein. Continuing with the method 400, at process step 415, the phase currents and (and optionally phase voltages) are measured while conducting the various tests of process step 410 for the MDE component 210 to the motor 230 through a harnessing 225. Finally, the method 400 also includes isolating the fault within the electric motor system based on the sensed current values as depicted at process step 420.

According to another embodiment, applying the voltage and current according to the gate switching sequence includes removing a previous voltage and current across sensor detection points of sensors of the electric motor system in response to detecting the fault. Applying the voltage and current also includes cycling the application of the voltage and current through gate drives of the switches of the inverter that corresponds to each phase of the electric motor system. According to another embodiment, applying the voltage and current according to the gate switching sequence includes holding a selected pair of switching devices 222, 223 of the inverter 220 on for an sufficient period to sense current sourced or sunk in each instance for each motor phase and direction, and repeating the applying process step for all combination of switching devices and phases.

According to another embodiment, isolating the fault based on the sensed current values further includes analyzing the sensed current values to isolate detected failures between the MDE component 210 and the motor 230. Accordingly, in one or more embodiments, the ability to isolate the location of a fault to individual components e.g. a line replaceable unit denoted an LRU of the system 100 facilitates avoiding, incorrect replacements of non-faulted components of the electric motor system 100. For example the fault isolation can help a user more accurately identify that a fault is originating from a selected component in the motor system 100 e.g., the MDE component 210 or motor 230 as opposed to somewhere else in the system 100.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Aspects of the present invention are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of detecting and isolating a fault in an electric motor system having a motor drive electronics (MDE) component that is configured to drive an electric motor having a plurality of phases through harnessing, the method comprising:
   detecting, with the motor drive electronics component, the fault in the electric motor system;
   applying a first known excitation, at the MDE component, according to a selected gate switching sequence for a first phase and a second phase of the plurality of phases of the electric motor in a first direction;
   sensing a phase current value of the MDE component for each phase of plurality of phases of the electric motor associated with the applying;
   providing a second known excitation, at the MDE component, according to a selected gate switching sequence for the first phase and the second phase of the plurality of phases of the electric motor system in an opposite direction of the first direction;
   measuring a phase current value in the MDE component for each phase of the electric motor associate with the providing;
   repeating the applying, sensing, providing and measuring for every possible combination of phases of the electric motor;
   isolating the fault within the electric motor system based on the sensed and measured current values; and
   identifying the fault of a particular coil of the electric motor based at least in part on measuring current values in the first direction and the second direction that have symmetrical measured current values.

2. The method of claim 1, wherein the applying comprises activating a sourcing switching device for the first phase and a sinking switching device for the second phase.

3. The method of claim 1, wherein the providing comprises activating a sourcing switching device for the second phase and a sinking switching device for the first phase.

4. The method of claim 1, wherein if the phase current values for each phase of the plurality of phases sensed matches the phase current values for each plurality of phases measured, it is indicative of at least one of an open phase of the electric motor and harness or a short in a winding of the electric motor and harness.

5. The method of claim 4, wherein the fault is isolatable to either an open circuit fault of the electric motor or a short circuit of the electric motor and the fault is isolatable to a particular phase of the electric motor.

6. The method of claim 1, wherein if the phase current values for each phase of the plurality of phases sensed does not match the phase current values for each plurality of phases measured, it is indicative of at a failure of the MDE component.

7. The method of claim 6, wherein the failure of the MDE component is isolatable to at least one of an open circuited source switching device, a short circuited source switching device, an open circuited sink switching device and a short circuited sink switching device for a particular phase of the MDE component.

8. The method of claim 7 wherein the failure of the MDE component is isolatable to a current sense feedback circuit for a particular phase of the MDE component.

9. The method of claim 7 wherein s failure of the current sense feedback circuit of the MDE component for the particular phase is further isolatable to a type of failure of the current sense feedback circuit for that particular phase.

10. The method of claim 1, wherein the repeating results defining test results based on the number of phases of the electric motor.

11. The method of claim 10, wherein the electric motor is a three phase motor and the repeating results in three sets of applying, sensing, providing, and measuring.

12. The method of claim 1, wherein isolating the fault based on the sensed current and measured current values further comprises:
analyzing the sensed current and measured current values;
deriving differences between the sensed current and measured current values and expected current values based on the analysis; and
identifying fault location possibilities based on the differences.

13. The method of claim 1, further comprising identifying and replacing an individual line replaceable component of the electric motor system in response to the isolating the fault.

14. The method of claim 1, wherein the electric motor system is included in an aircraft.

15. An electric motor system for detecting and isolating a fault, the system comprising:
a motor drive electronic (MDE) component comprising an inverter with a phase leg including a sourcing switching device and sinking switching device for each phase leg;
an electric motor operably connected to the MDE component, wherein the electric motor has a plurality of phases driven by the phase legs from the inverter;
a harness that connects the electric motor to the MDE component, wherein the harnessing includes a plurality of wires; and
a plurality of sensors that are connected to the MDE component and are configured to sense current values of the MDE component for each phase of the plurality of phases,
wherein the MDE component is further configured to implement a method to detect the fault in the electric motor system, apply a first known excitation according to a gate switching sequence for a first phase and a second phase of the plurality of phases of the electric motor in a first direction, receive a sensed phase current value of the MDE component for each phase of plurality of phases of the electric motor associated with the applied first known excitation; provide a second known excitation, at the MDE component, according to a selected gate switching sequence for the first phase and the second phase of the plurality of phases of the electric motor system in an opposite direction of the first direction; and measure a phase current value in the MDE component for each phase of the electric motor associated with the provided second known excitation; and repeat the apply, sense, provide and measure steps for every possible combination of phases of the electric motor;
isolating the fault within the electric motor system based on the sensed and measured current values; and
identifying the fault of a particular coil of the electric motor based at least in part on measuring current values in the first direction and the second direction that have symmetrical measured current values.

16. The electric motor system of claim 15, wherein the apply step of the method comprises activating a sourcing switching device for the first phase and a sinking switching device for the second phase and the provide step of the method comprises activating a sourcing switching device for the second phase and a sinking switching device for the first phase.

17. The electric motor system of claim 16, wherein if the phase current values for each phase of the plurality of phases sensed matches the phase current values for each plurality of phases measured, it is indicative of at least one of an open phase of the electric motor and harness or a short in a winding of the electric motor and harness.

18. The electric motor system of claim 16, wherein the fault is isolatable to either an open circuit fault of the electric motor or a short circuit of the electric motor and the fault is isolatable to a particular phase of the electric motor.

19. The electric motor system of claim 16, wherein if the phase current values for each phase of the plurality of phases sensed does not match the phase current values for each plurality of phases measured, it is indicative of at a failure of the MDE component.

20. The electric motor system of claim 19, wherein the failure of the MDE component is isolatable to at least one of an open circuited source switching device, a short circuited source switching device, an open circuited sink switching device, a short circuited sink switching device for a particular phase of the MDE component, and a current sense feedback circuit for a particular phase of the MDE component.

21. The electric motor system of claim 16, wherein the electric motor is a three-phase motor and the electric motor system is included in an aircraft.

22. The electric motor system of claim 16, further comprising identifying and replacing an individual line replaceable component of the electric motor system in response to the isolating the fault.

* * * * *